(12) United States Patent
Abe

(10) Patent No.: US 12,477,774 B2
(45) Date of Patent: Nov. 18, 2025

(54) SEMICONDUCTOR DEVICE HAVING SENSING ELEMENT

(71) Applicant: FUJI ELECTRIC CO., LTD., Kawasaki (JP)

(72) Inventor: Yuya Abe, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 424 days.

(21) Appl. No.: 18/158,689

(22) Filed: Jan. 24, 2023

(65) Prior Publication Data

US 2023/0352579 A1   Nov. 2, 2023

(30) Foreign Application Priority Data

Mar. 29, 2022 (JP) ................. 2022-054495

(51) Int. Cl.
　　*H10D 30/66* (2025.01)
　　*H10D 62/17* (2025.01)
　　*H10D 84/00* (2025.01)

(52) U.S. Cl.
　　CPC ......... *H10D 30/669* (2025.01); *H10D 30/668* (2025.01); *H10D 62/393* (2025.01); *H10D 84/144* (2025.01)

(58) Field of Classification Search
　　CPC ..... H10D 30/66; H10D 62/127; H10D 30/668
　　See application file for complete search history.

(56) References Cited

U.S. PATENT DOCUMENTS

2019/0341483 A1　11/2019　Harada et al.
2020/0335622 A1* 10/2020　Hiyoshi ............... H10D 30/669

FOREIGN PATENT DOCUMENTS

JP　　　2018-133433 A　　8/2018

* cited by examiner

*Primary Examiner* — Wasiul Haider

(57) ABSTRACT

A semiconductor device includes a main element and a sensing element each including a drift region of a first conductivity-type, a well region of a second conductivity-type provided at an upper part of the drift region, a first main electrode region of the first conductivity-type provided at an upper part of the well region, a gate electrode buried with a gate insulating film interposed in a trench, and a main electrode connected to the first main electrode region, the isolation region including an element-isolation insulating film provided on a top surface of a semiconductor base body interposed between the well regions, and a first wire provided on a top surface of the element-isolation insulating film and electrically connected to the main electrode of the main element.

6 Claims, 13 Drawing Sheets

SEMICONDUCTOR DEVICE HAVING SENSING ELEMENT

CROSS-REFERENCE TO RELATED APPLICATION

This application claims benefit of priority under 35 USC 119 based on Japanese Patent Application No. 2022-054495 filed on Mar. 29, 2022, the entire contents of which are incorporated by reference herein.

BACKGROUND OF THE INVENTION

1. Field of the Invention

The present invention relates to a semiconductor device.

2. Description of the Related Art

JP 2018-133433 A discloses a semiconductor device having a configuration in which a semiconductor element through which a main current flows (referred to below as a "main element") and a semiconductor element that detects the main current flowing through the main element (referred to below as a "sensing element") are connected in parallel and monolithically integrated on the same semiconductor chip.

The sensing element has a size (an active area) of about a few hundredths to a few ten-thousandths of the main element, and a current having a ratio corresponding to this size flows through the sensing element. A current is led to flow through the sensing element that is several times the main current flowing through the main element in terms of a ratio of the main current to the current flowing through the sensing element as a sense ratio.

Monitoring the current flowing through the sensing element can indirectly monitor the main current flowing through the main element, so as to prevent damage caused by an overcurrent of the main element and a load.

The semiconductor device described above cannot sufficiently avoid a leak current caused when a power supply (a battery) is connected wrongly in an opposite direction.

SUMMARY OF THE INVENTION

In view of the foregoing problems, the present invention provides a semiconductor device having a configuration including a main element and a sensing element integrated on the same semiconductor chip so as to avoid a leak current when a battery is connected in an opposite direction.

An aspect of the present invention inheres in a semiconductor device including: a main element; a sensing element configured to detect a current of the main element; and an isolation region isolating the main element and the sensing element from each other, each of the main element and the sensing element including a drift region of a first conductivity-type provided in a semiconductor base body, a well region of a second conductivity-type provided at an upper part of the drift region, a first main electrode region of the first conductivity-type provided at an upper part of the well region, a gate electrode buried with a gate insulating film interposed in a trench in contact with the first main electrode region, the well region, and the drift region, and a main electrode electrically connected to the first main electrode region, the isolation region including an element-isolation insulating film provided on a top surface of the semiconductor base body interposed between the well region of the main element and the well region of the sensing element, and a first wire provided on a top surface of the element-isolation insulating film and electrically connected to the main electrode of the main element.

Another aspect of the present invention inheres in a semiconductor device including a main element; a sensing element configured to detect a current of the main element; and an isolation region isolating the main element and the sensing element from each other, each of the main element and the sensing element including a drift region of a first conductivity-type provided in a semiconductor base body, a well region of a second conductivity-type provided at an upper part of the drift region, a first main electrode region of the first conductivity-type provided at an upper part of the well region, a gate electrode buried with a gate insulating film interposed in a trench in contact with the first main electrode region, the well region, and the drift region, and a main electrode electrically connected to the first main electrode region, the isolation region including a first electrode buried with a gate insulating film interposed in an element-isolation trench provided in the semiconductor base body interposed between the well region of the main element and the well region of the sensing element, and electrically connected to the main electrode of the main element.

DETAILED DESCRIPTION

Figure 1:
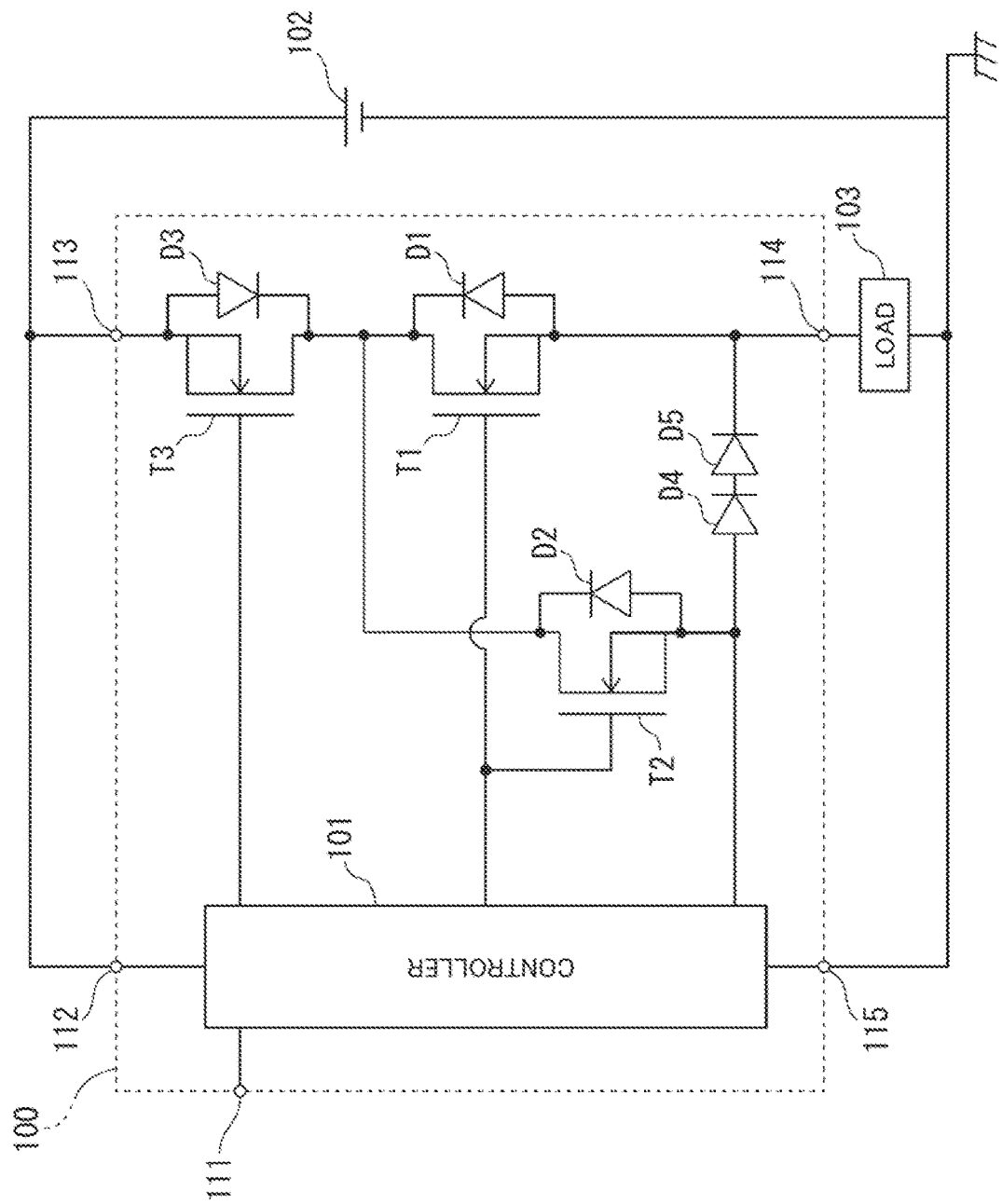
FIG. 1 is an equivalent circuit diagram of a semiconductor device according to a first embodiment when a battery is connected in an appropriate direction.

With reference to the Drawings, first and second embodiments of the present invention will be described below.

In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the embodiment, a "first main electrode region" and a "second main electrode region" are a main electrode region of a semiconductor element, in which a main current flows in or out. The first main electrode region is assigned to a semiconductor region which is an emitter region or a collector region in an insulated-gate bipolar transistor (IGBT). The first main electrode region is assigned to a semiconductor region which is a source region or a drain region in a field-effect transistor (FET) or a static induction transistor (SIT). The first main electrode region is assigned to a semiconductor region which is an anode region or a cathode region in a static induction (SI) thyristor or a gate turn-off (GTO) thyristor. The second main electrode region is assigned to a semiconductor region which is not assigned as the first main electrode region and will be the emitter region or the collector region in the IGBT, the source region or the drain region in the FET or the SIT, and the anode region or the cathode region in the SI thyristor or the GTO thyristor. That is, when the first main electrode region is the source region, the second main electrode region means the drain region. When the first main electrode region is the emitter region, the second main electrode region means the collector region. When the first main electrode region is the anode region, the second main electrode region means the cathode region.

Further, definitions of directions such as an up-and-down direction such as "top surface" or "bottom surface" or right-and-left direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity-type is an n-type and a second conductivity-type is a p-type. However, the relationship of the conductivity types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration or a relatively low specific resistance as compared to a semiconductor region denoted by the symbol "n" or "p" without "+". A semiconductor region denoted by the symbol "n" or "p" attached with "−" indicates that such semiconductor region has a relatively low impurity concentration or a relatively high specific resistance as compared to a semiconductor region denoted by the symbol "n" or "p" without "−". However, even when the semiconductor regions are denoted by the same reference symbols "n" and "n", it is not indicated that the semiconductor regions have exactly the same impurity concentration or the same specific resistance.

First Embodiment

A semiconductor device according to a first embodiment is illustrated below with a case applicable to a power IC for vehicles called an intelligent power switch (IPS). As illustrated in FIG. 1, the semiconductor device 100 according to the first embodiment includes an input terminal 111, a first power-supply terminal 112, a second power-supply terminal 113, an output terminal 114, and a ground terminal 115. The input terminal 111 is connected to an external microcomputer, for example. The first power-supply terminal 112 and the second power-supply terminal 113 are connected to a positive electrode of a battery 102 that is a power supply of the semiconductor device 100 according to the first embodiment. FIG. 1 illustrates a case in which the battery 102 is connected in an appropriate direction. The output terminal 114 is connected to one end of a load 103 that is a target to be driven by the semiconductor device 100 according to the first embodiment. The ground terminal 115 is connected to the ground together with a negative electrode of the battery 102 and the other end of the load 103.

The semiconductor device 100 according to the first embodiment includes a main element T1, a sensing element (a detection element) T2, an auxiliary element T3, and a controller 101. The main element T1, the sensing element T2, the auxiliary element T3, and the controller 101 are monolithically integrated on the same semiconductor chip. The semiconductor device 100 according to the first embodiment does not necessarily have the configuration including the auxiliary element T3 and the controller 101. Alternatively, the auxiliary element T3 and the controller 101 may be provided on another semiconductor chip different from the semiconductor chip on which the main element T1 and the sensing element T2 are integrated. The auxiliary element T3 and the controller 101 may be provided on different semiconductor chips independently of each other. The controller 101 may be provided on a semiconductor chip different from the semiconductor chip on which the main element T1, the sensing element T2, and the auxiliary element T3 are integrated together so as to be electrically connected to the main element T1, the sensing element T2, and the auxiliary element T3.

While FIG. 1 illustrates a case in which the main element T1, the sensing element T2, and the auxiliary element T3 are each a MOSFET, the respective elements may each be the other element such as an IGBT. FIG. 1 also illustrates the case of including the single main element T1, the single sensing element T2, and the single auxiliary element T3, the semiconductor device may include a plurality of main elements T1, a plurality of sensing elements T2, and a plurality of auxiliary elements T3, the respective elements being arranged parallel to each other.

A diode D1 that is a free-wheeling diode is connected antiparallel to the main element T1. A diode D2 that is a free-wheeling diode is connected antiparallel to the sensing element T2. A diode D3 that is a free-wheeling diode is connected antiparallel to the auxiliary element T3. The diodes D to D3 may each be a body diode of a MOSFET corresponding to the main element T1, the sensing element T2, and the auxiliary element T3.

A source of the main element T1 is connected to one end of the load 103 via the output terminal 114. The source of the main element T1 is connected to the controller 101 and a source of the sensing element T2 via two-stage diodes D4 and D5. The diodes D4 and D5 each have a function of interrupting a leak current when the battery 102 is connected in the wrong direction. While FIG. 1 illustrates the case of using the two-stage diodes D4 and D5, the number of the stages is determined as appropriate, and the single diode or three or more diodes may be connected. A drain of the main element T1 is connected to a drain of the sensing element T2 and a drain of the auxiliary element T3. A gate of the main element T1 is connected to the controller 101 together with a gate of the sensing element T2. The main element T1 executes an ON-OFF operation according to a control signal applied to the gate from the controller 101 so as to drive the load 103.

The source of the sensing element T2 is connected to the controller 101. The source of the sensing element T2 is connected to the source of the main element T1 via the diodes D4 and D5. The drain of the sensing element T2 is connected to the drain of the main element T1 and the drain of the auxiliary element T3. The gate of the sensing element T2 is connected to the controller 101 together with the gate of the main element T1. The sensing element T2 is a current-sensing element that detects a current flowing through the main element T1. The sensing element T2 executes the ON-OFF operation at the same timing as the main element T1 according to the control signal applied to the gate from the controller 101.

The drain of the auxiliary element T3 is connected to the drain of the main element T1 and the drain of the sensing element T2. The gate of the main element T1 is connected to the controller 101. A source of the auxiliary element T3 is connected to the positive electrode of the battery 102 via the second power-supply terminal 113. The auxiliary element T3 has a structure with the drain opposed to the drain of the main element T1, and the diode D3 connected antiparallel to the auxiliary element T3 has a function of interrupting the leak current when the battery 102 is connected in the wrong direction. The auxiliary element T3 executes the ON-OFF operation at the same timing as the main element T1 and the sensing element T2 according to the control signal applied to the gate from the controller 101.

The diode D3 such as a Schottky diode may only be connected instead of both the auxiliary element T3 and the diode D3. An anode of the diode D3 is connected to the second power-supply terminal 113, and a cathode is connected to the drain of the main element T1. The connection of at least the diode D3 can interrupt the leak current when the battery 102 is connected in the wrong direction.

The controller 101 is configured to include semiconductor elements such as horizontal MOSFETs integrated together. The controller 101 applies the control signal to the respective gates of the main element T1, the sensing element T2, and the auxiliary element T3 in accordance with an input signal input from the external microcomputer via the input terminal 111 so as to control the ON-OFF operations of the main element T1, the sensing element T2, and the auxiliary element T3. The controller 101 detects a current flowing through the sensing element T2 so as to indirectly detect a main current flowing through the main element T1. The controller 101, when detecting the flow of an overcurrent through the sensing element T2, turns OFF the main element T1 so as to prevent the overcurrent from flowing through the load 103.

Figure 2:
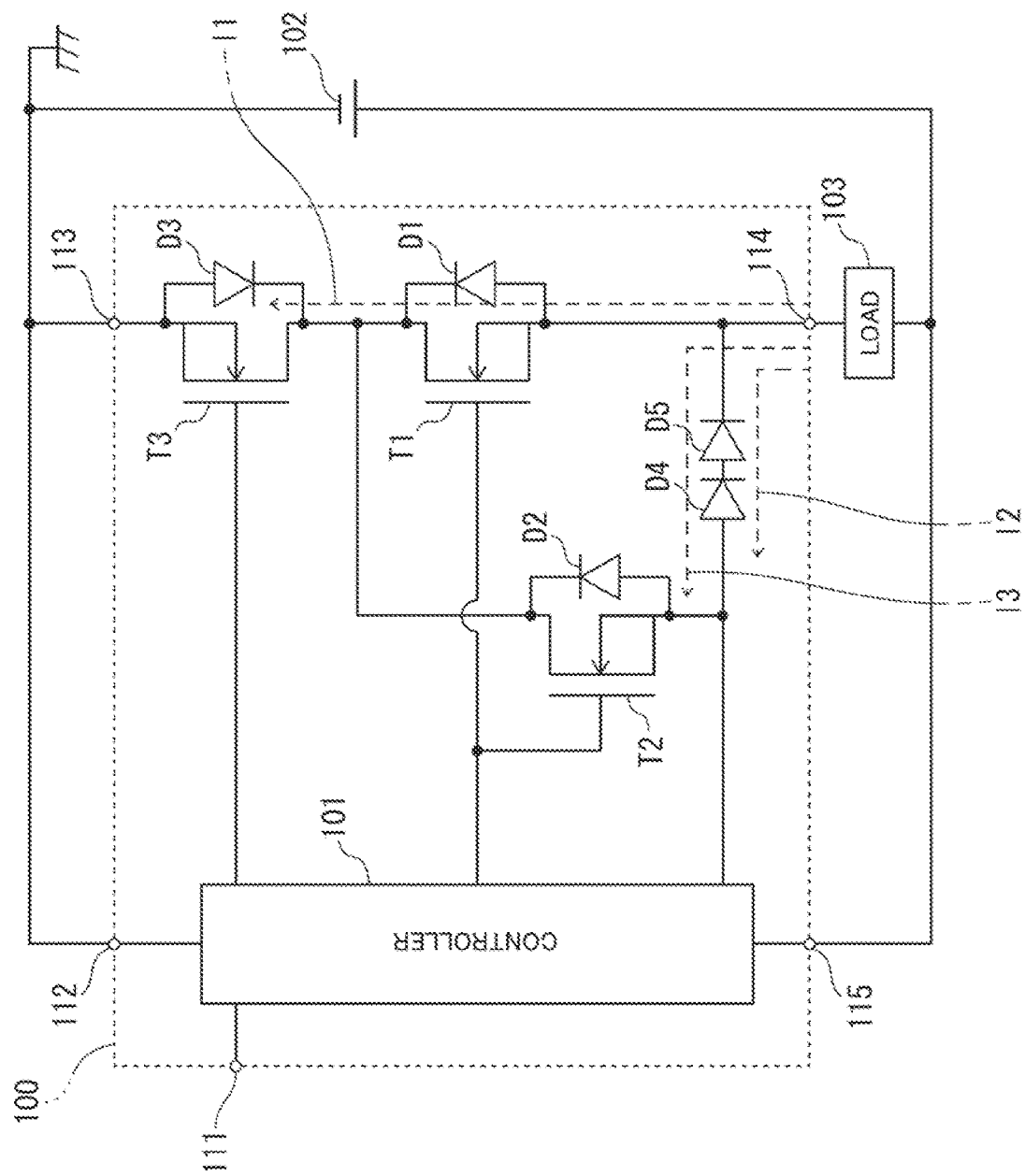
FIG. 2 is an equivalent circuit diagram of the semiconductor device according to the first embodiment when the battery is connected in the opposite direction.

FIG. 2 illustrates a case in which the battery 102 is connected in the opposite direction with respect to the semiconductor device 100 according to the first embodiment. Upon the opposite connection of the battery 102, the controller 101 detects the state of the opposite connection and outputs the control signal for turning OFF the main element T1, the sensing element T2, and the auxiliary element T3. The main element T1, the sensing element T2, and the auxiliary element T3 are each then led to be the OFF-state in accordance with the control signal applied from the controller 101.

While a leak current I1 flowing from the output terminal 114 tends to flow through via the diode D1 connected antiparallel to the main element T1 upon the opposite connection of the battery 102, as schematically illustrated by the arrows indicated by the broken lines in FIG. 2, the diode D3 connected antiparallel to the auxiliary element T3 can interrupt the leak current I1. Similarly, while a leak current I2 flowing from the output terminal 114 tends to flow toward the controller 101, the diodes D4 and D5 connected between the output terminal 114 and the source of the sensing element T2 can interrupt the leak current I2.

Figure 3:
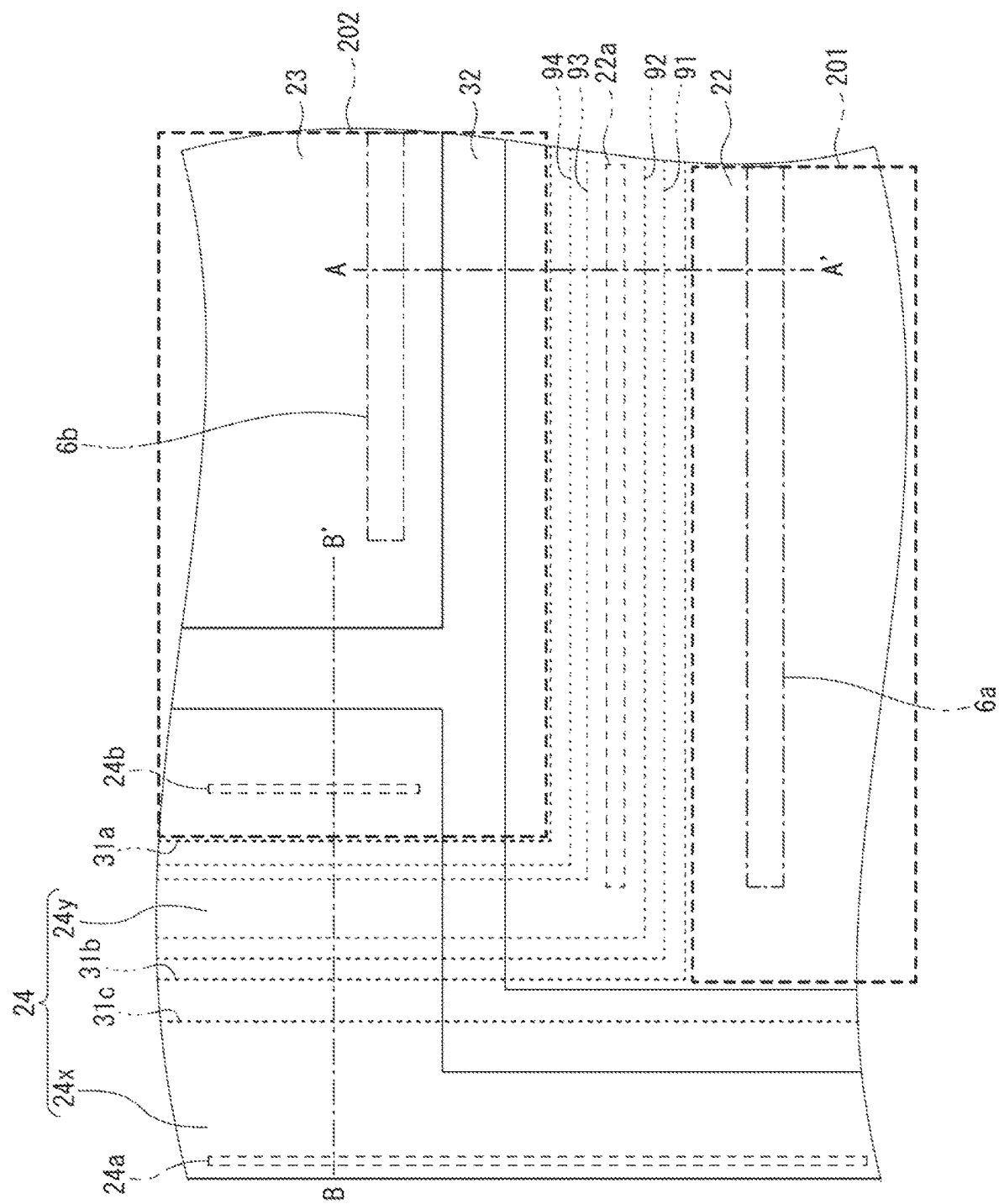
FIG. 3 is a plan view illustrating a main part of the semiconductor device according to the first embodiment.

FIG. 3 is a plan view illustrating a main part of the semiconductor device 100 according to the first embodiment illustrated in FIG. 1. As indicated by the broken lines in FIG. 3, the semiconductor device according to the first embodiment includes a main element (a main element region) 201 and a sensing element (a sensing element region) 202 that are monolithically integrated on the same semiconductor chip. The main element 201 includes a region corresponding to the main element T1 illustrated in FIG. 1, and the sensing element 202 includes a region corresponding to the sensing element T2 illustrated in FIG. 1. The active area of the sensing element 202 is set to a predetermined ratio to the active area of the main element 201.

Although not illustrated in FIG. 3, the semiconductor device according to the first embodiment further includes an auxiliary element region corresponding to the auxiliary element T3 illustrated in FIG. 1, diode regions corresponding to the respective diodes D4 and D5 illustrated in FIG. 1, and a control circuit region corresponding to the controller 101 illustrated in FIG. 1.

Figure 4:
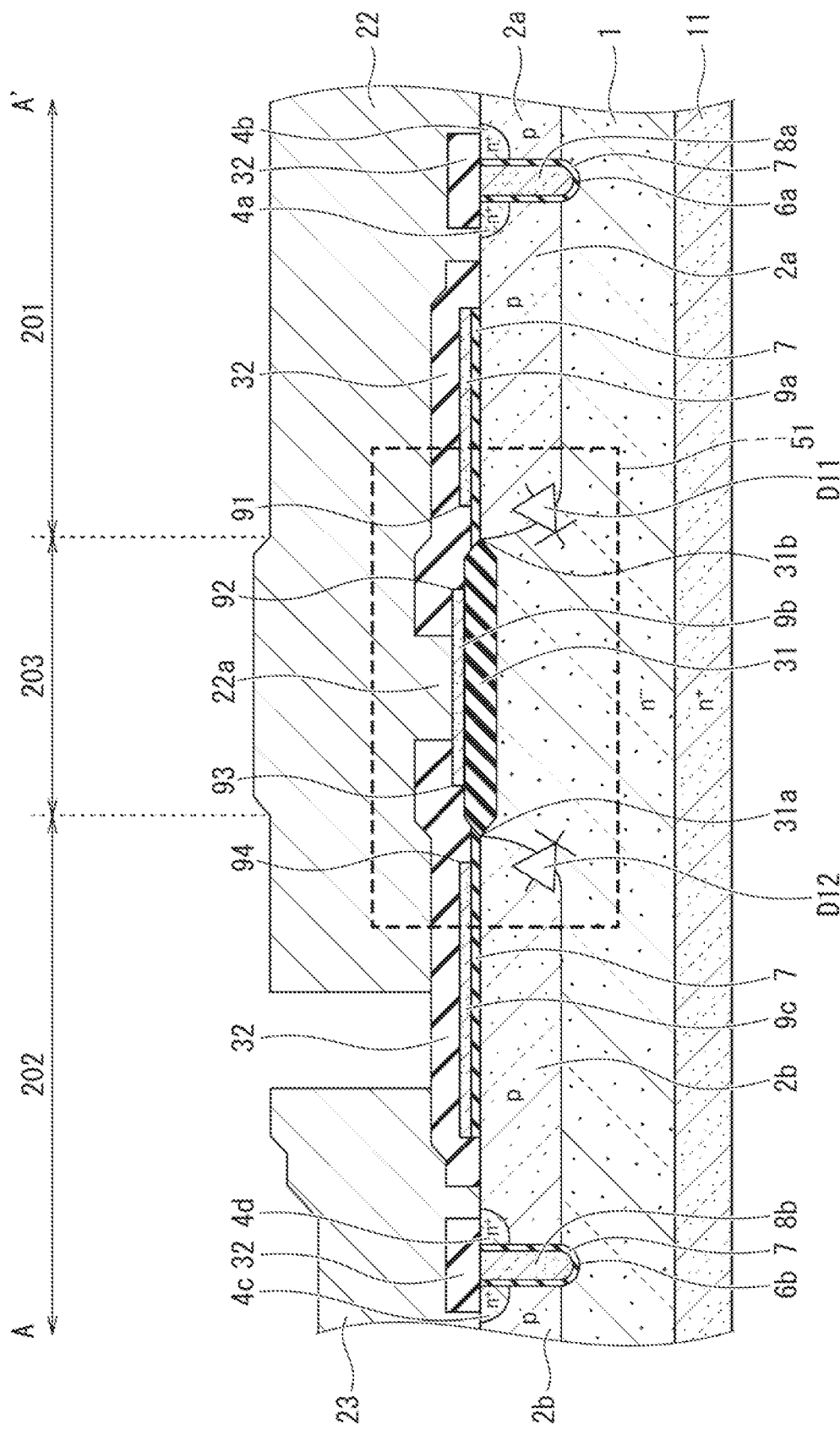
FIG. 4 is a cross-sectional view taken along line A-A' in FIG. 3.

FIG. 4 is a cross-sectional view taken along line A-A' across the main element 201 and the sensing element 202 illustrated in FIG. 3. As illustrated in FIG. 4, the semiconductor device according to the first embodiment includes a semiconductor base body (1, 11) implementing the semiconductor chip. The semiconductor base body (1, 11) includes a low-specific resistance layer 11 that is a semiconductor substrate of a first conductivity-type ($n^+$-type), and a high-specific resistance layer 1 of $n^-$-type having a lower impurity concentration than the low-specific resistance layer 11 and epitaxially grown on the low-specific resistance layer 11. While the present embodiment is illustrated with a case in which the semiconductor base body (1, 11) includes silicon (Si) as base material, for example, the base material is not limited to Si. The $n^+$-type low-specific resistance layer 11 may be formed on the bottom surface of the $n^-$-type semiconductor substrate of the high-specific resistance layer 1 by ion implantation or thermal diffusion so as to implement the semiconductor base body (1, 11).

The main element 201 illustrated on the right side in FIG. 4 includes a part of the high-specific resistance layer 1 as a drift region. The main element 201 further includes a part of the $n^+$-type low-specific resistance layer 11 as a second main electrode region (a drain region) deposited on the bottom surface of the drift region.

A well region 2a of a second conductivity-type (p-type) is selectively provided at the upper part of the high-specific resistance layer 1. The upper part of the well region 2a is provided with first main electrode regions (source regions) 4a and 4b of $n^+$-type. A main electrode (a source electrode) 22 is deposited on the top surface side of the source regions 4a and 4b so as to be in contact with the source regions 4a and 4b. A material used for the source electrode 22 can be metal such as aluminum (Al), an Al alloy, or copper (Cu). Examples of the Al alloy include Al—Si, Al—Cu—Si, and Al—Cu.

A trench 6a is dug from the top surface side of the well region 2a so as to reach the high-specific resistance layer 1. The trench 6a is in contact with the source regions 4a and 4b, the well region 2a, and the high-specific resistance layer 1. A gate insulating film 7 is deposited on the inner surface of the trench 6a. The gate insulating film 7 as used herein can be a silicon oxide film (a $SiO_2$ film), for example, and other examples other than the $SiO_2$ film include a silicon oxynitride (SiON) film, a strontium oxide (SrO) film, a silicon nitride ($Si_3N_4$) film, and an aluminum oxide ($Al_2O_3$) film. Still other examples include a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film. Further, two or more of these single films may be chosen and stacked on one another so as to be used as a composite film.

A gate electrode 8a is buried inside the trench 6a with the gate insulating film 7 interposed. The top surface of the gate electrode 8a is covered with an interlayer insulating film 32 so as to be insulated from the source electrode 22. The material used for the gate electrode 8a may be polysilicon (doped polysilicon) with which n-type impurity ions or p-type impurity ions are heavily doped, for example. Other examples other than the doped polysilicon (DOPOS) include a refractory metal such as tungsten (W), molybdenum (Mo), and titanium (Ti), and silicide of the refractory metal and the polysilicon. The material used for the gate electrode 8a may also be polycide that is a composite film of the polysilicon and the silicide of the refractory metal. The gate insulating film 7 and the gate electrode 8a implement a trench gate structure (7, 8a).

A gate wire 9a is deposited on the top surface of the well region 2a at a position separated from the trench 6a with the gate insulating film 7 interposed. The gate wire 9a is covered with the interlayer insulating film 32. Although not illustrated in the cross section in FIG. 4, the gate wire 9a is connected to the gate electrode 8a of the main element 201 on the front side of the sheet of FIG. 4, for example. The gate wire 9a includes the same material as the gate electrode 8a such as doped polysilicon.

The sensing element 202 illustrated on the left side in FIG. 4 includes a part of the high-specific resistance layer 1 as the drift region. The sensing element 202 further includes a part of the $n^+$-type low-specific resistance layer 11 as the second main electrode region (the drain region) deposited on the bottom surface of the drift region. A well region 2b of p-type is selectively provided at the upper part of the high-specific resistance layer 1 separately from the well region 2a. The upper part of the well region 2b is provided with first main electrode regions (source regions) 4c and 4d of $n^+$-type.

A main electrode (a source electrode) 23 is deposited on the top surface side of the source regions 4c and 4d so as to be in contact with the source regions 4c and 4d. The source electrode 23 is provided separately from the source electrode 22 in the main element 201. The source electrode 23 includes the same material as the source electrode 22.

A trench 6b is dug from the top surface side of the well region 2b so as to reach the high-specific resistance layer 1. The trench 6b is in contact with the source regions 4c and 4d, the well region 2b, and the high-specific resistance layer 1. The gate insulating film 7 is deposited on the inner surface of the trench 6b. A gate electrode 8b is buried inside the trench 6b with the gate insulating film 7 interposed. The gate electrode 8b is covered with the interlayer insulating film 32 so as to be insulated from the source electrode 23.

A gate wire 9c is deposited on the top surface of the well region 2b separately from the trench 6b with the gate insulating film 7 interposed. The gate wire 9c is covered with the interlayer insulating film 32. The source electrode 22 of the main element 201 and the source electrode 23 of the sensing element 23 are separated from each other over the gate wire 9c. Although not illustrated in the cross section in FIG. 4, the gate wire 9c is connected to the gate electrode 8b of the sensing element 202 on the front side of the sheet of FIG. 4, for example. The gate wire 9c includes the same material as the gate electrode 8b such as doped polysilicon.

An isolation region 203 is provided in the middle in the right-left direction in FIG. 4 so as to isolate the main element 201 and the sensing element 202 from each other. The isolation region 203 is provided with an element-isolation insulating film 31 such as a film of local oxidation of silicon (a LOCOS film) selectively deposited on the top surface of the high-specific resistance layer 1 interposed between the well region 2a in the main element 201 and the well region 2b in the sensing element 202. A first wire 9b is deposited on the top surface of the element-isolation insulating film 31. The first wire 9b is isolated from the gate wire 9a of the main element 201 and the gate wire 9c of the sensing element 202.

The source electrode 22 of the main element 201 extends to cover the top surface of the first wire 9b with the interlayer insulating film 32 interposed. The first wire 9b is connected to the source electrode 22 of the main element 201 via a contact 22a provided at the opening of the interlayer insulating film 32.

As indicated by the broken line in FIG. 4, a parasitic MOS structure 51 is implemented in the isolation region 203 by the high-specific resistance layer 1, the element-isolation insulating film 31, and the first wire 9b interposed between the well region 2a in the main element 201 and the well region 2b in the sensing element 202. As schematically indicated by the circuit symbols in FIG. 4, a p-n junction diode D11 is implemented by the well region 2a of the main element 201 and the high-specific resistance layer 1, and a p-n junction diode D12 is implemented by the well region 2b of the sensing element 202 and the high-specific resistance layer 1.

Figure 5:
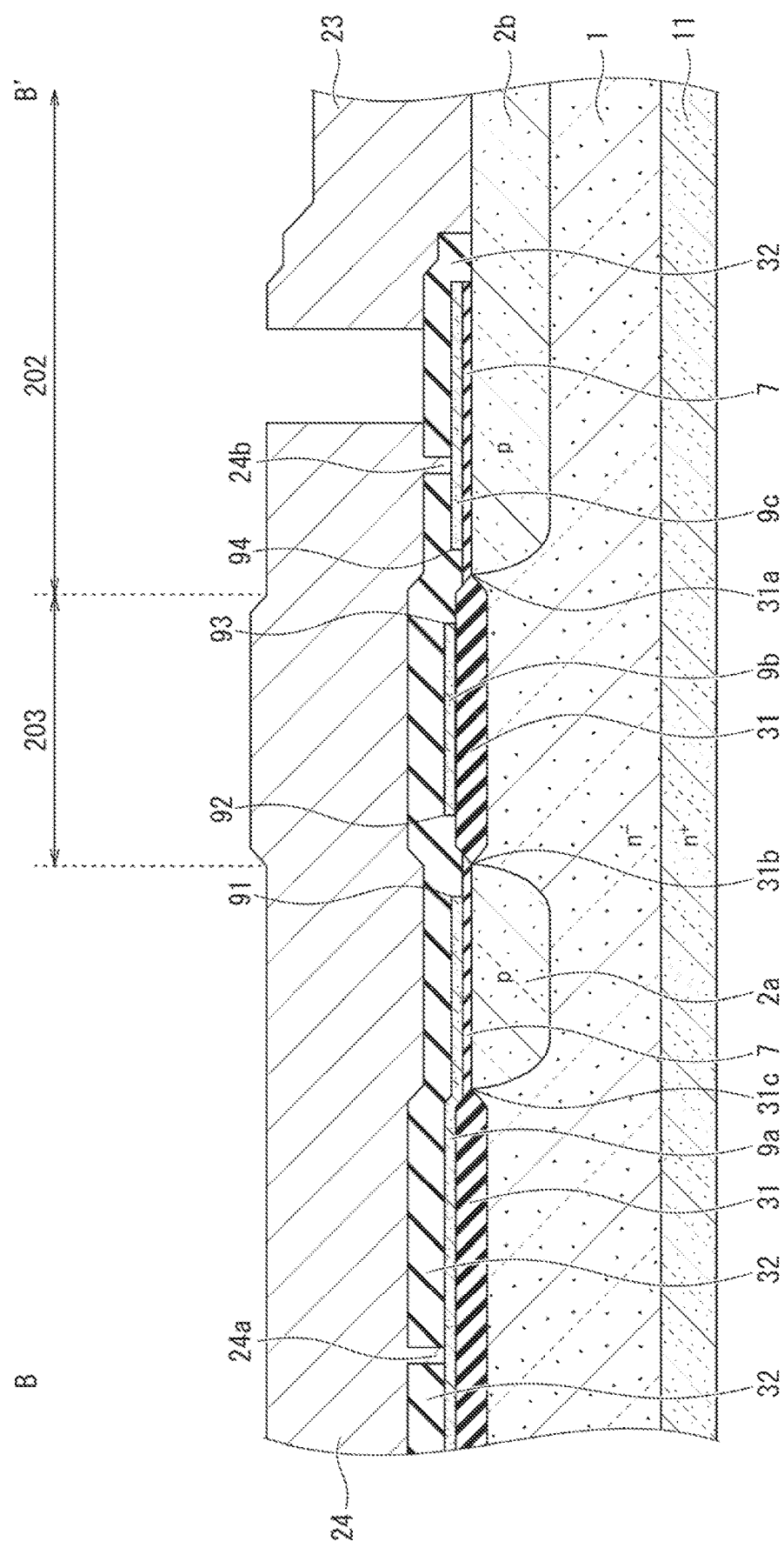
FIG. 5 is a cross-sectional view taken along line B-B' in FIG. 3.

FIG. 5 is a cross-sectional view taken along line B-B' in FIG. 3. The gate wire 9c is deposited on the top surface of the well region 2b with the gate insulating film 7 interposed in the sensing element 202 illustrated on the right side of FIG. 5. The source electrode 23 is deposited on the top surface side of the gate wire 9c with the interlayer insulating film 32 interposed. A gate runner 24 is also deposited on the top surface side of the gate wire 9c separately from the source electrode 23 with the interlayer insulating film 32 interposed. The gate wire 9c is connected to the gate runner 24 via a contact 24b provided at the opening of the interlayer insulating film 32.

As illustrated in FIG. 5, the well region 2a is provided at the upper part of the high-specific resistance layer 1 separately from the well region 2b. The well region 2a is the region common to the well region 2a illustrated in FIG. 4. The element-isolation insulating film 31 is selectively provided on the top surface of the high-specific resistance layer 1 interposed between the respective well regions 2a and 2b in the isolation region 203 indicated in the middle in the right-left direction in FIG. 5. The first wire 9b is deposited on the top surface of the element-isolation insulating film 31. The first wire 9b is the region common to the first wire 9b illustrated in FIG. 4. The first wire 9b is isolated from the other gate wires 9a and 9c. The first wire 9b is covered with the interlayer insulating film 32.

The gate wire 9a is deposited on the top surface of the well region 2a illustrated in FIG. 5 with the gate insulating film 7 interposed. The gate wire 9a is the region common to the gate wire 9a illustrated in FIG. 4. The gate wire 9a extends to cover the top surface of the element-isolation insulating film 31 located on the left side of the well region 2a. The gate runner 24 is provided on the top surface side of the gate wire 9a with the interlayer insulating film 32 interposed. The gate wire 9a is connected to the gate runner 24 via a contact 24a provided at the opening of the interlayer insulating film 32.

The gate runner 24 is connected to a gate pad (not illustrated). The gate runner 24 is electrically connected to the gate electrode 8a of the main element 201 via the gate wire 9a of the main element 201, and is also electrically connected to the gate electrode 8b of the sensing element 202 via the gate wire 9c of the sensing element 202.

The planer layout of FIG. 3 indicates the source electrode 22 of the main element 201, the source electrode 23 of the sensing element 202, and the gate runner 24 each by the solid line. The gate runner 24 illustrated on the left side of FIG. 3 includes a stripe part 24x extending in the upper-lower direction in FIG. 3, and a projecting part 24y projecting in the right-left direction in FIG. 3 toward the sensing element 202. The source electrode 22 of the main element 201 illustrated in the area from the middle to the lower right side of FIG. 3 is provided separately from the stripe part 24x of the gate runner 24. The source electrode 23 of the sensing element 202 illustrated on the upper right side of FIG. 3 is provided separately from the source electrode 22 of the main element 201 and the projecting part 24y of the gate runner 24.

FIG. 3 schematically indicates an edge 91 of the gate wire 9a of the main element 201, edges 92 and 93 of the first wire 9b of the isolation region 203, and an edge 94 of the gate wire 9c of the sensing element 202 illustrated in FIGS. 4 and 5 by the broken lines. The edge 91 of the gate wire 9a of the main element 201 is separated from the edge 92 of the first wire 9b of the isolation region 203 while having the L-shaped planar pattern. The edge 93 of the first wire 9b of the isolation region 203 is separated from the edge 94 of the gate wire 9c of the sensing element 202 while having the L-shaped planar pattern. The first wire 9b of the isolation region 203 defined by the respective edges 92 and 93 has the L-shaped planar pattern.

FIG. 3 schematically indicates edges 31a and 31b of the element-isolation insulating film 31 of the isolation region 203 and an edge 31c of the element-isolation insulating film 31 toward the stripe part 24x of the gate runner 24 illustrated in FIG. 4 and FIG. 5 by the broken lines. The element-isolation insulating film 31 of the isolation region 203 defined by the respective edges 31a and 31b has the L-shaped planar pattern so as to overlap with the first wire 9b of the isolation region 203 defined by the edges 92 and 93.

FIG. 3 schematically indicates a contact 22a for connecting the source electrode 22 of the main element 201 and the first wire 9b of the isolation region 203 with each other by the broken line. FIG. 3 also schematically indicates a contact 24a for connecting the gate runner 24 and the gate wire 9a of the main element 201 with each other by the broken line. The contact 24a is provided in the stripe part 24x of the gate runner 24. FIG. 3 also schematically indicates the contact 24b for connecting the gate runner 24 and the gate wire 9c of the sensing element 202 with each other by the broken line. The contact 24b is provided in the projecting part 24y of the gate runner 24.

FIG. 3 schematically indicates the trench 6a of the main element 201 by the dashed and dotted line. The trench 6a has a stripe-shaped planar pattern extending in the right-left direction in FIG. 3. Although not illustrated in FIG. 3, the main element 201 may be provided with a plurality of trenches extending parallel to the trench 6a and having the same structure as the trench 6a. FIG. 3 also schematically indicates the trench 6b of the sensing element 202 by the dashed and dotted line. Although not illustrated in FIG. 3, the sensing element 202 may be provided with a plurality of trenches extending parallel to the trench 6b and having the same structure as the trench 6b.

COMPARATIVE EXAMPLE

Figure 6:
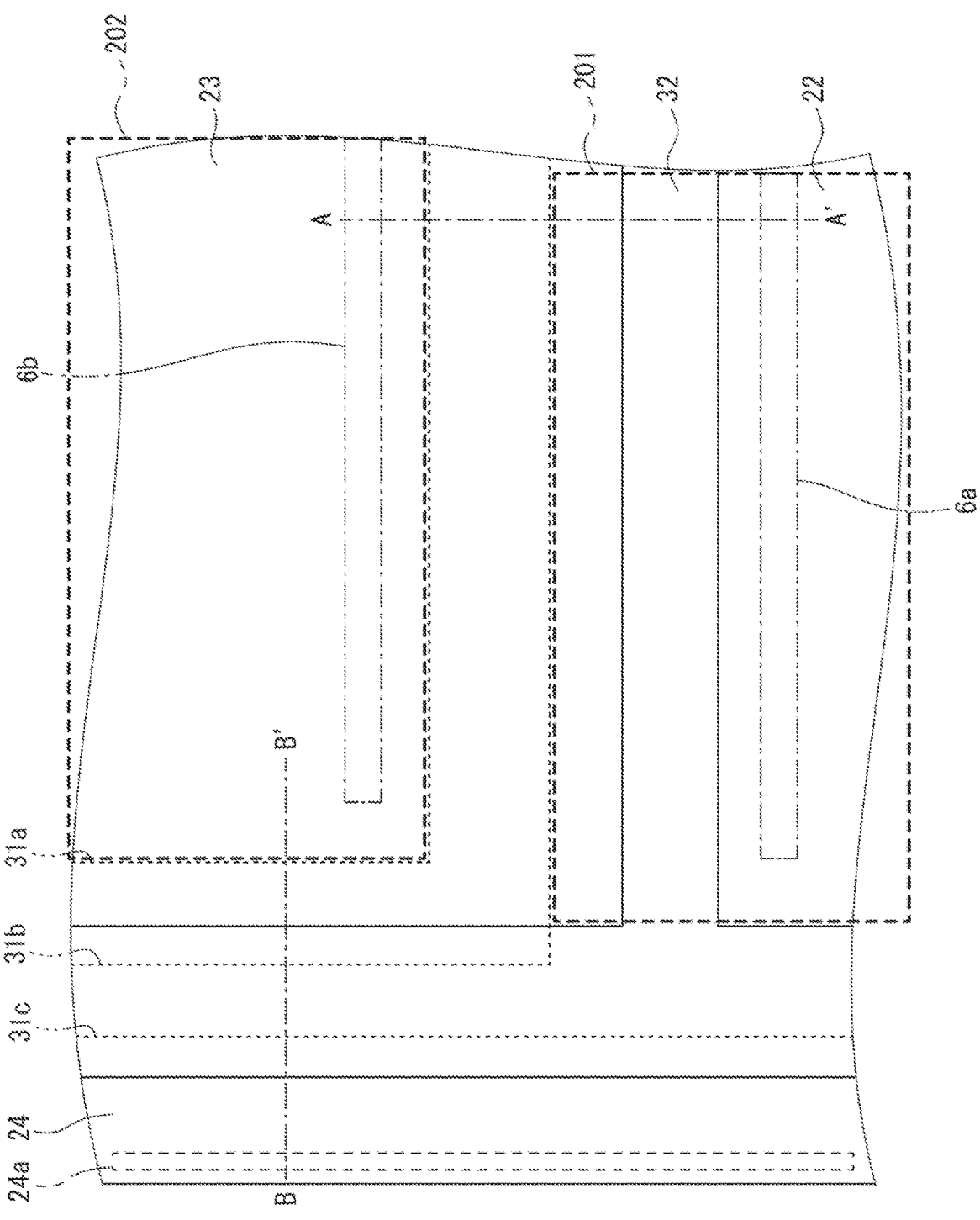
FIG. 6 is a plan view illustrating a semiconductor device of a comparative example.
Figure 7:
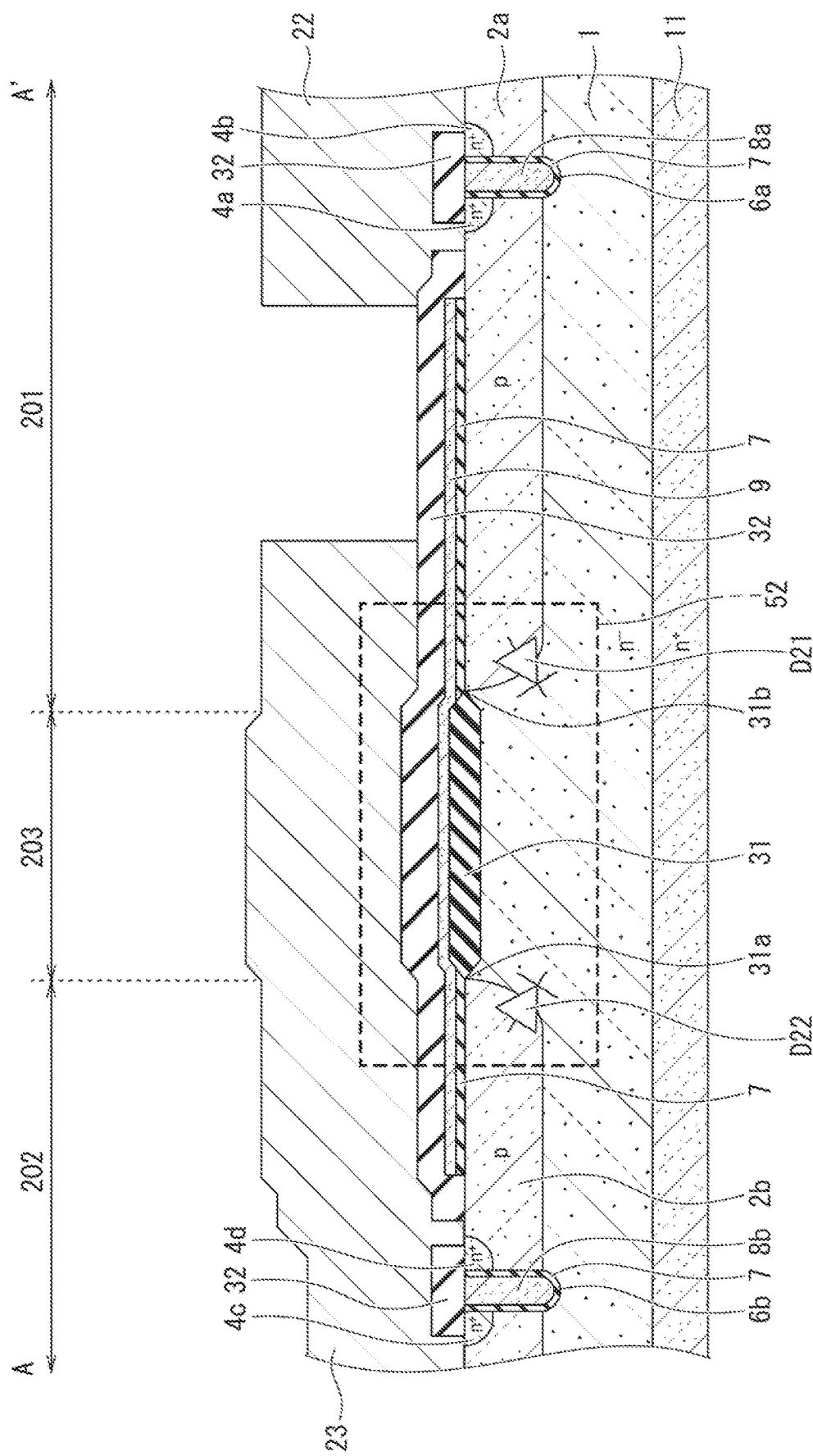
FIG. 7 is a cross-sectional view taken along line A-A' in FIG. 6.

A semiconductor device of a comparative example is explained below. The semiconductor device of the comparative example has an equivalent circuit similar to that of the semiconductor device according to the first embodiment illustrated in FIG. 1 and FIG. 2. FIG. 6 is a plan view illustrating a main part of the semiconductor device of the comparative example. FIG. 7 is a cross-sectional view taken along line A-A' in FIG. 6, and FIG. 8 is a cross-sectional view taken along line B-B' in FIG. 6.

Figure 8:
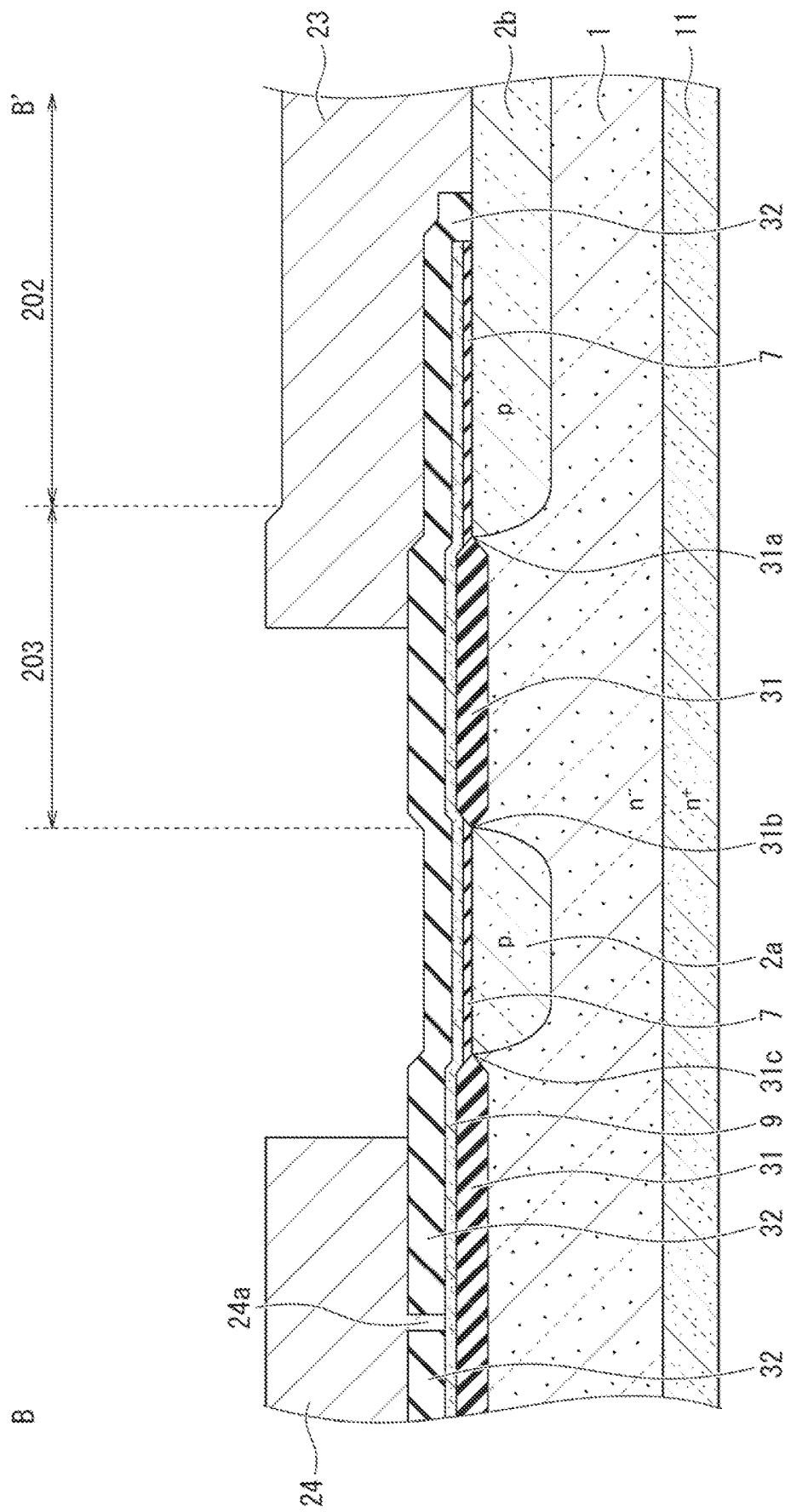
FIG. 8 is a cross-sectional view taken along line B-B' in FIG. 6.

As illustrated in FIG. 7 and FIG. 8, the semiconductor device of the comparative example differs from the semiconductor device according to the first embodiment in that the gate wire 9 is continuously provided across the main element 201, the sensing element 202, and the isolation region 203. The gate wire 9 is covered with the interlayer insulating film 32 so as to be insulated from the source electrode 22 of the main element 201 and the source electrode 23 of the sensing element 202. As illustrated in FIG. 8, the gate wire 9 is connected to the gate runner 24 via the contact 24a provided in the interlayer insulating film 32. This leads a gate potential of a parasitic MOS structure 52 in the isolation region 203 to be the same as a gate potential in the main element 201 and a gate potential in the sensing element 202.

When a case is presumed in which the battery 102 is connected in the opposite direction to the semiconductor device of the comparative example, as in the case illustrated in FIG. 2, the gate potential of the main element T1 and the sensing element T2 is led to be a low level, and the main element T1 and the sensing element T2 are thus in the OFF-state. Since the semiconductor device of the comparative example has the structure in which the gate wire 9 serving as a gate electrode of the parasitic MOS structure 52 is continuously (integrally) provided across the main element 201 and the sensing element 202, as illustrated in FIG. 7 and FIG. 8, the gate potential of the parasitic MOS structure 52 is led to be a low level that is the same as the gate potential of each of the main element 201 and the sensing element 202.

Upon the opposite connection of the battery 102 to the semiconductor device of the comparative example, a difference in potential is caused between the respective sources of the main element T1 and the sensing element T2 since the diodes D4 and D5 are provided between the sources of the main element T1 and the sensing element T2, as illustrated in FIG. 2. For example, the source potential of the main element T1 is led to be a positive potential of about 16 volts that is substantially the same as the battery potential, while the source potential of the sensing element T2 is about zero volts that is an internal GND potential. This case leads a p-n junction diode D21 implemented by the well region 2a and the high-specific resistance layer 1 in the main element 201 as schematically indicated in FIG. 7 is biased in the forward direction, increasing a back gate potential of the parasitic MOS structure 52 (a potential in the high-specific resistance layer 1) accordingly.

The case in which the gate potential of the parasitic MOS structure 52 is at the low level and the back gate potential of the parasitic MOS structure 52 is increased provides a p-type channel layer in the surface layer of the parasitic MOS structure 52 and leads the parasitic MOS structure 52 to operate, which decreases the breakdown voltage between the devices of the main element 201 and the sensing element 202. As a result, a leak current I3 is caused to flow through via the parasitic MOS structure 52, as schematically indicated by the broken line in FIG. 2. This problem could be solved such that the gate wire 9b of the main element 201 on the element-isolation insulating film 31 implementing the parasitic MOS structure 52 is removed, but is actually hard to solve in view of the gate connection regarding the sensing element 202. Further, the connection of the gate of the sensing element 202 with a wire inevitably increases the cost.

In contrast, the semiconductor device according to the first embodiment has the structure in which the first wire 9b on the element-isolation insulating film 31 in the parasitic MOS structure 51 is isolated from the gate wire 9a of the main element 201 and the gate wire 9c of the sensing element 202, as illustrated in FIG. 4. In addition, the first wire 9b on the element-isolation insulating film 31 in the parasitic MOS structure 51 is connected to the source electrode 22 via the contact 22a provided at the opening of the interlayer insulating film 32 so as to lead the gate potential of the parasitic MOS structure 51 to be the same as the source potential of the main element 201.

If the battery 102 is connected in the opposite direction to the semiconductor device according to the first embodiment, as illustrated in FIG. 2, the gate potential of the main element T1 and the sensing element T2 is led to be a low level, and the main element T1 and the sensing element T2 are thus in the OFF-state. However, since the first wire 9b in the parasitic MOS structure 51 illustrated in FIG. 4 is isolated from the gate wire 9a of the main element 201 and the gate wire 9c of the sensing element 202, and is connected to the source electrode 22 via the contact 22a provided at the opening of the interlayer insulating film 32, the gate potential that is the potential of the first wire 9b in the parasitic MOS structure 51 is led to be a high level that is the same as the source potential of the main element T1.

Upon the opposite connection of the battery 102 to the semiconductor device according to the first embodiment, as illustrated in FIG. 2, a difference in potential is caused between the respective sources of the main element T1 and the sensing element T2 since the diodes D4 and D5 are provided between the sources of the main element T1 and the sensing element T2. The source potential of the main element T1 is then led to be a positive potential, and the p-n junction diode D11 implemented by the well region 2a and the high-specific resistance layer 1 in the main element 201 illustrated in FIG. 4 is thus biased in the forward direction, increasing the back gate potential of the parasitic MOS structure 51 (the potential in the high-specific resistance layer 1) accordingly. This problem is the same as in the case of the semiconductor device of the comparative example.

However, while the back gate potential of the parasitic MOS structure 51 illustrated in FIG. 4 is increased, the gate potential of the parasitic MOS structure 51 is at the high level, so as to ensure the breakdown voltage between the devices of the main element 201 and the sensing element 202 with the operation of the parasitic MOS structure 51 avoided. This can ensure the breakdown voltage of the main element 201 and the sensing element 202 if the battery 102 is connected in the opposite direction without a great change in the chip size or the procedure executed, so as to prevent or decrease the leak current.

Figure 9:
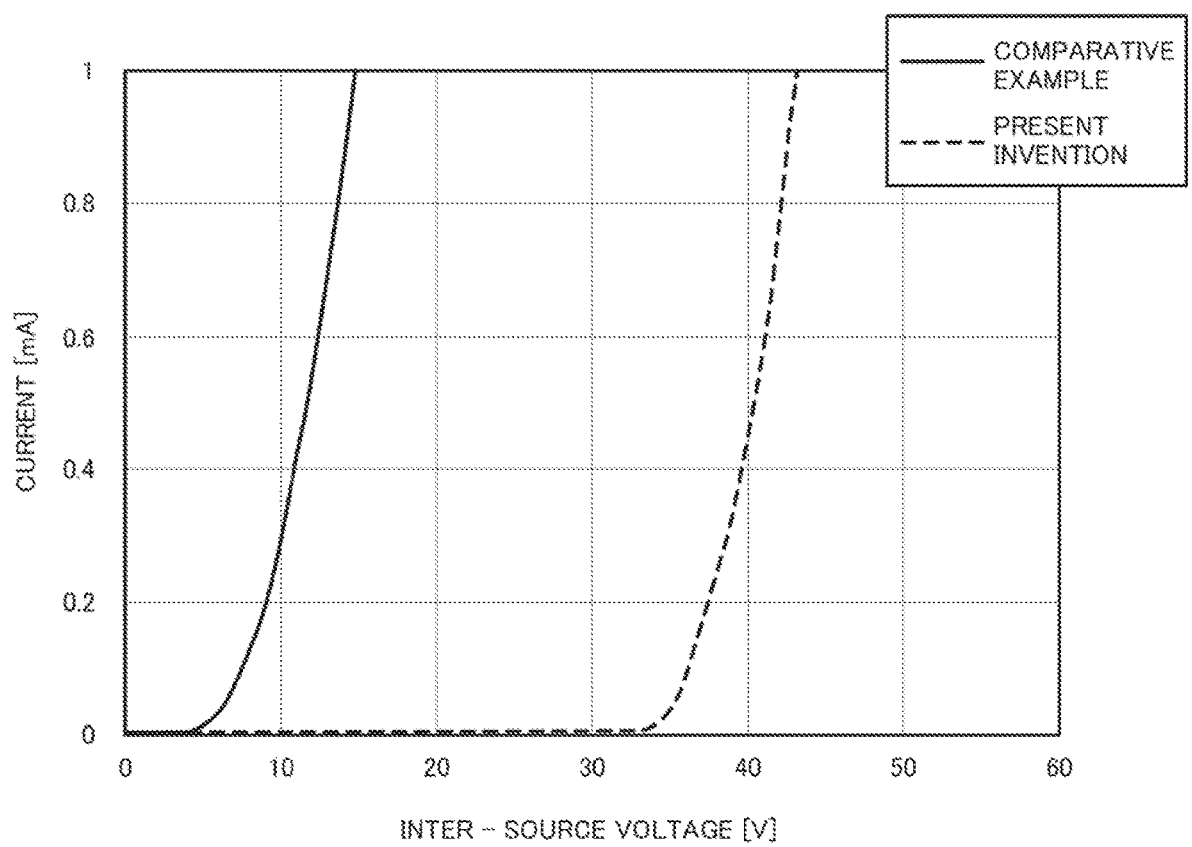
FIG. 9 is a graph showing a relation between an inter-source voltage and a leak current in a main element and a sensing element.

FIG. 9 shows a simulation result regarding the breakdown voltage between the main element and the sensing element in each of the semiconductor device according to the first embodiment and the semiconductor device of the comparative example. The axis of abscissas indicates the potential between the sources of the main element and the sensing element, and the axis of ordinates indicates the leak current. The leak current derived from the parasitic MOS structure was confirmed at the inter-source potential of around 5 volts in the semiconductor device of the comparative example (simply referred to as the "comparative example"), and the breakdown voltage thus could not sufficiently be ensured in view of the voltage of the battery. In contrast, the semiconductor device according to the first embodiment (referred to as the "present invention") could ensure the breakdown voltage at the inter-source potential of 35 volts or greater, so as to interrupt the leak current upon the case of the opposite connection of the battery.

Second Embodiment

Figure 10:
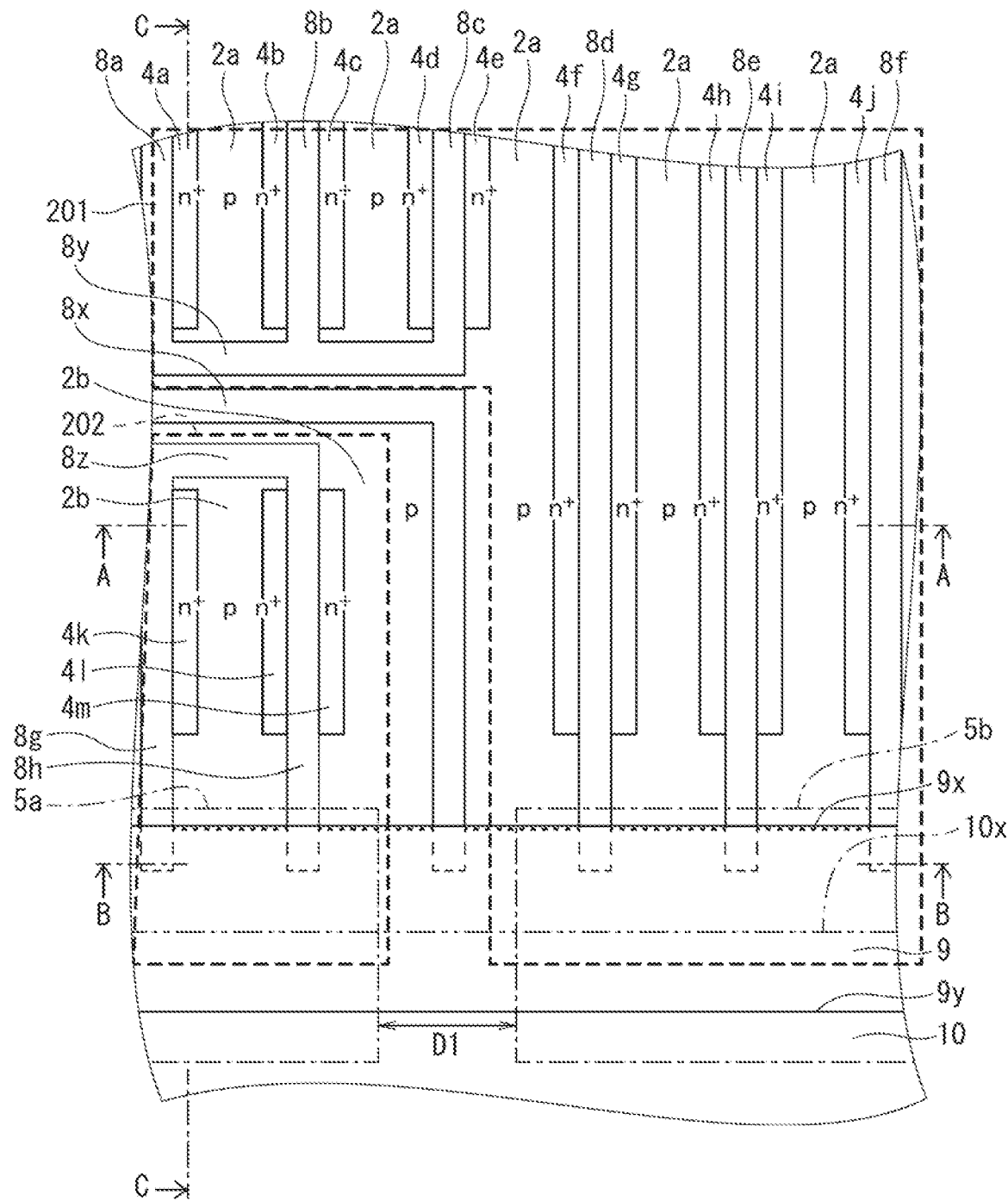
FIG. 10 is a plan view illustrating a main part of a semiconductor device according to a second embodiment.

A semiconductor device according to a second embodiment has an equivalent circuit similar to that of the semiconductor device according to the first embodiment illustrated in FIG. 1 and FIG. 2. The semiconductor device according to the second embodiment includes the main element 201 and the sensing element 202 integrated on the same semiconductor chip, as illustrated in FIG. 10.

The main element 201 includes the p-type well region 2a, the n$^+$-type source regions 4a to 4j deposited at the upper part of the well region 2a so as to be in contact with the well region 2a, and the gate electrodes 8a to 8f with the side surfaces in contact with the respective source regions 4a to 4j with gate insulating films (not illustrated) interposed. The respective gate electrodes 8a to 8f extend parallel to each other in the upper-lower direction in FIG. 10. The gate electrode 8y having a structure similar to that of the respective gate electrodes 8a to 8f is also provided to extend in the direction perpendicular to the gate electrodes 8a to 8f (in the right-left direction in FIG. 10), and is connected to the respective edges of the gate electrodes 8a to 8c.

The sensing element 202 includes the p-type well region 2b, the n$^+$-type source regions 4k, 4l, and 4m deposited at the upper part of the well region 2b so as to be in contact with the well region 2b, and the gate electrodes 8g and 8h with the side surfaces in contact with the respective source regions 4k, 4l, and 4m with gate insulating films (not illustrated) interposed. The respective gate electrodes 8g and 8h extend parallel to each other in the upper-lower direction in FIG. 10. The gate electrode 8z having a structure similar to that of the respective gate electrodes 8g and 8h is also provided to extend in the direction perpendicular to the gate electrodes 8g and 8h (in the right-left direction in FIG. 10), and is connected to the respective edges of the gate electrodes 8g and 8h.

A first electrode 8x is provided at the boundary between the main element 201 and the sensing element 202 as an isolation region so as to isolate the main element 201 and the sensing element 202 from each other. The first electrode 8x is buried in a trench with a gate insulating film (not illustrated) interposed. The first electrode 8x includes parts extending parallel to each other in the upper-lower direction in FIG. 10, and parts extending parallel to each other in the right-left direction in FIG. 10.

The respective lower edges of the well regions 2a and 2b are indicated by the thick dotted lines in the planar pattern in FIG. 10. The respective positions of the lower edges of the well regions 2a and 2b substantially conform to the position of the edge 9x of the gate wire 9.

Figure 11:
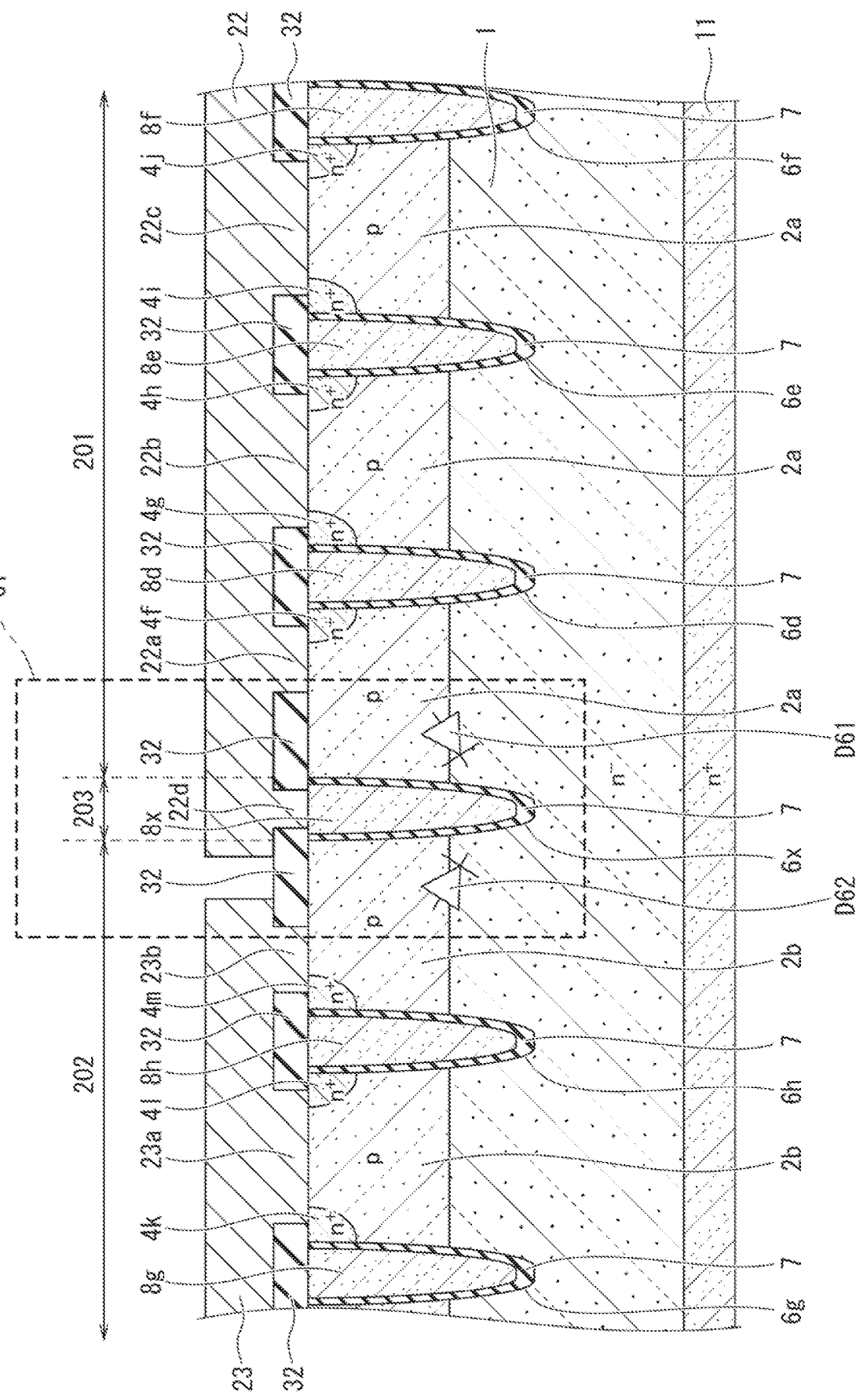
FIG. 11 is a cross-sectional view as viewed from direction A-A in FIG. 10.

FIG. 11 is a cross-sectional view as viewed from direction A-A corresponding to the right-left direction in FIG. 10. As illustrated in FIG. 11, the semiconductor device according to the second embodiment includes the semiconductor base body (1, 11) including the $n^+$-type low-specific resistance layer 11 and the $n^-$-type high-specific resistance layer 1. A part of the high-specific resistance layer 1 serves as a drift region in the main element 201 illustrated on the right side in FIG. 11, and a part of the low-specific resistance layer 11 serves as a drain region. The p-type well region 2a is provided at the upper part of the high-specific resistance layer 1. The $n^+$-type source regions 4f to 4j are provided at the upper part of the well region 2a. The source regions 4f to 4j are connected to the source electrode 22 via the contacts 22a to 22c.

The trenches 6d to 6f are provided to penetrate the well region 2a to reach the high-specific resistance layer 1. The trenches 6d to 6f are in contact with the source regions 4f to 4j, the well region 2a, and the high-specific resistance layer 1, and are in contact with the p-n junction between the source regions 4f to 4j and the well region 2a and the p-n junction between the well region 2a and the high-specific resistance layer 1. The gate electrodes 8d to 8f are buried in the trenches 6d to 6f with the gate insulating film 7 interposed. The interlayer insulating film 32 is deposited on the respective top surfaces of the gate electrodes 8d to 8f.

A part of the high-specific resistance layer 1 serves as a drift region in the sensing element 202 illustrated on the left side in FIG. 11, and a part of the low-specific resistance layer 11 serves as a drain region. The p-type well region 2b is provided at the upper part of the high-specific resistance layer 1. The $n^+$-type source regions 4k, 4l, and 4m are provided at the upper part of the well region 2b. The source regions 4k, 4l, and 4m are connected to the source electrode 23 via the contacts 23a and 23b. The source electrode 23 is separated from the source electrode 22 in the main element 201.

The trenches 6g and 6h are provided to penetrate the well region 2b to reach the high-specific resistance layer 1. The trenches 6g and 6h are in contact with the source regions 4k, 4l, and 4m, the well region 2b, and the high-specific resistance layer 1, and are in contact with the p-n junction between the source regions 4k, 4l, and 4m and the well region 2b and the p-n junction between the well region 2b and the high-specific resistance layer 1. The gate electrodes 8g and 8h are buried in the trenches 6g and 6h with the gate insulating film 7 interposed. The interlayer insulating film 32 is deposited on the respective top surfaces of the gate electrodes 8g and 8h.

The isolation region 203 is provided between the main element 201 and the sensing element 202. A trench (an element-isolation trench) 6x is provided between the well region 2a of the main element 201 and the well region 2b of the sensing element 202 in the isolation region 203. The first electrode 8x is buried in the element-isolation trench 6x with the gate insulating film 7 interposed. The first electrode 8x is connected to the source electrode 22 of the main element 201 via the contact 22d provided at the opening of the interlayer insulating film 32.

As indicated by the broken line in FIG. 11, a parasitic MOS structure 61 is implemented in the isolation region 203 by the high-specific resistance layer 1, the insulating film 7, and the first electrode 8x interposed between the well region 2a in the main element 201 and the well region 2b in the sensing element 202. As schematically indicated by the circuit symbols in FIG. 11, a p-n junction diode D61 is implemented by the well region 2a of the main element 201 and the high-specific resistance layer 1, and a p-n junction diode D62 is implemented by the well region 2b of the sensing element 202 and the high-specific resistance layer 1.

Figure 12:
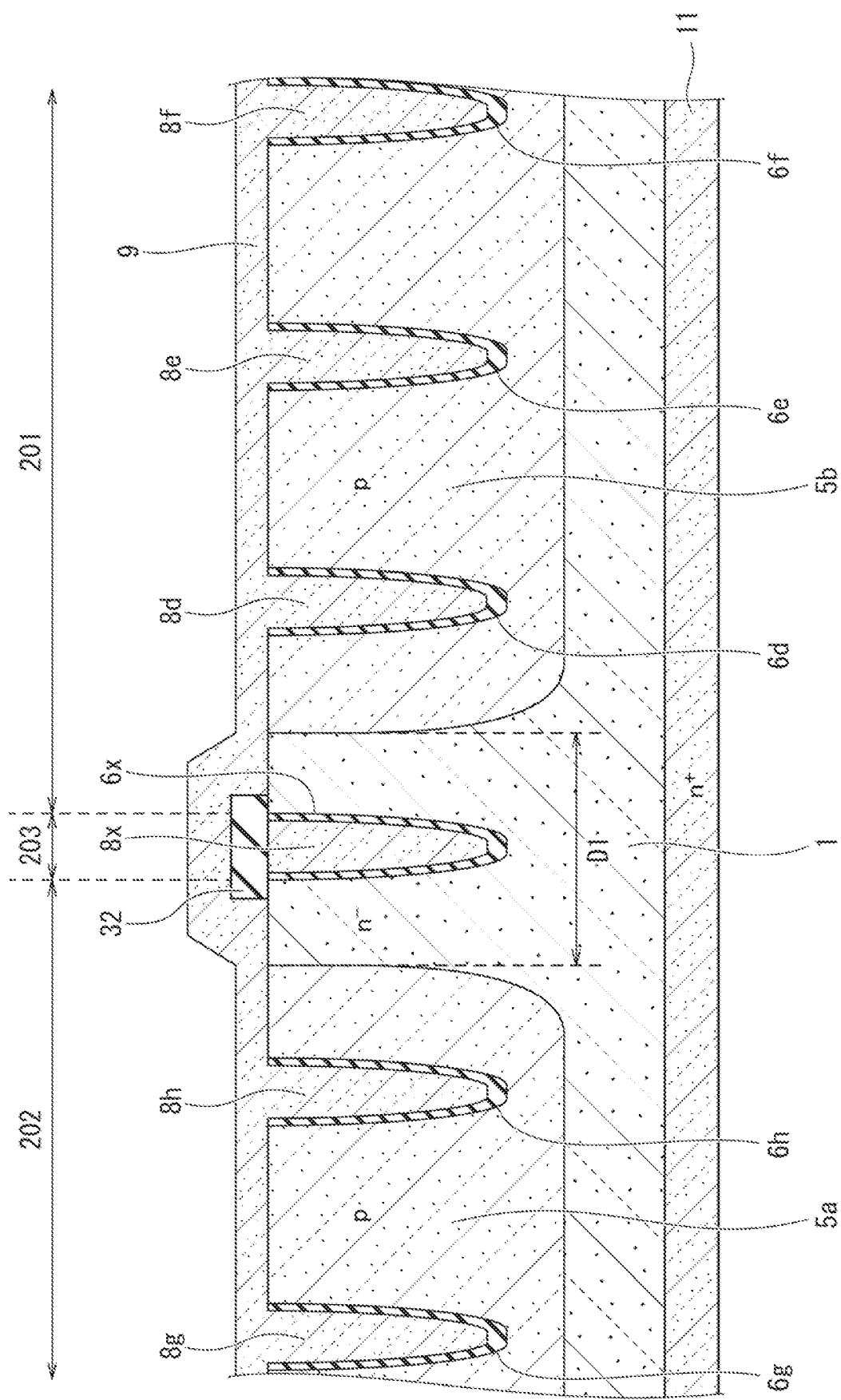
FIG. 12 is a cross-sectional view as viewed from direction B-B in FIG. 10.

FIG. 12 is a cross-sectional view as viewed from direction B-B corresponding to the right-left direction in FIG. 10. FIG. 12 illustrates the region adjacent to the edge of each of the trenches 6d to 6f of the main element 201, the trenches 6g and 6h of the sensing element 202, and the element-isolation trench 6x of the isolation region 203 in the longitudinal direction. The side surfaces and the bottom surfaces of the trenches 6g and 6h adjacent to the edges in the longitudinal direction in the sensing element 202 illustrated on the left side in FIG. 12 are covered with an electric-field release region 5a of p-type. Similarly, the side surfaces and the bottom surfaces of the trenches 6d to 6f adjacent to the edges in the longitudinal direction in the main element 201 illustrated on the right side in FIG. 12 are covered with an electric-field release region 5b of p-type.

The first electrode 8x adjacent to the edge of the element-isolation trench 6x in the longitudinal direction in the isolation region 203 illustrated in the middle in FIG. 12 is covered with the interlayer insulating film 32 so as to be isolated from the gate wire 9. The gate wire 9 is continuously provided along the main element 201 and the sensing element 202 across the top surface of the interlayer insulating film 32 covering the first electrode 8x. The gate wire 9 is connected to the respective gate electrodes 8d to 8f of the main element 201 and the respective gate electrodes 8g and 8h of the sensing element 202.

The electric-field release regions 5a and 5b are separated from each other in order to avoid an electrical short circuit between the well region 2b on the rightmost side in the sensing element 202 and the well region 2a on the leftmost side in the main element 201. This structure would cause an electric-field concentration around the region between the electric-field release regions 5a and 5b adjacent to the edge of the element-isolation trench 6x in the longitudinal direction not covered with the electric-field release regions 5a and 5b, which tends to decrease the breakdown voltage.

To deal with this, a distance D1 between the electric-field release regions 5a and 5b is defined so as to connect depletion layers extending from the p-n junctions between the drift region implemented by the high-specific resistance layer 1 and the respective electric-field release regions 5a and 5b with each other when a high voltage different from a voltage upon a normal operation is applied between the drain and the source in the main element 201 and the sensing element 202. The appropriate distance can release the electric field at the edge of the trench 6x in the longitudinal direction, so as to avoid a decrease in the breakdown voltage. When the breakdown voltage is about 60 volts, for example, the distance D1 between the respective electric-field release regions 5a and 5b is preferably set to a range of about 1 micrometer or greater and 3 micrometers or less.

Figure 13:
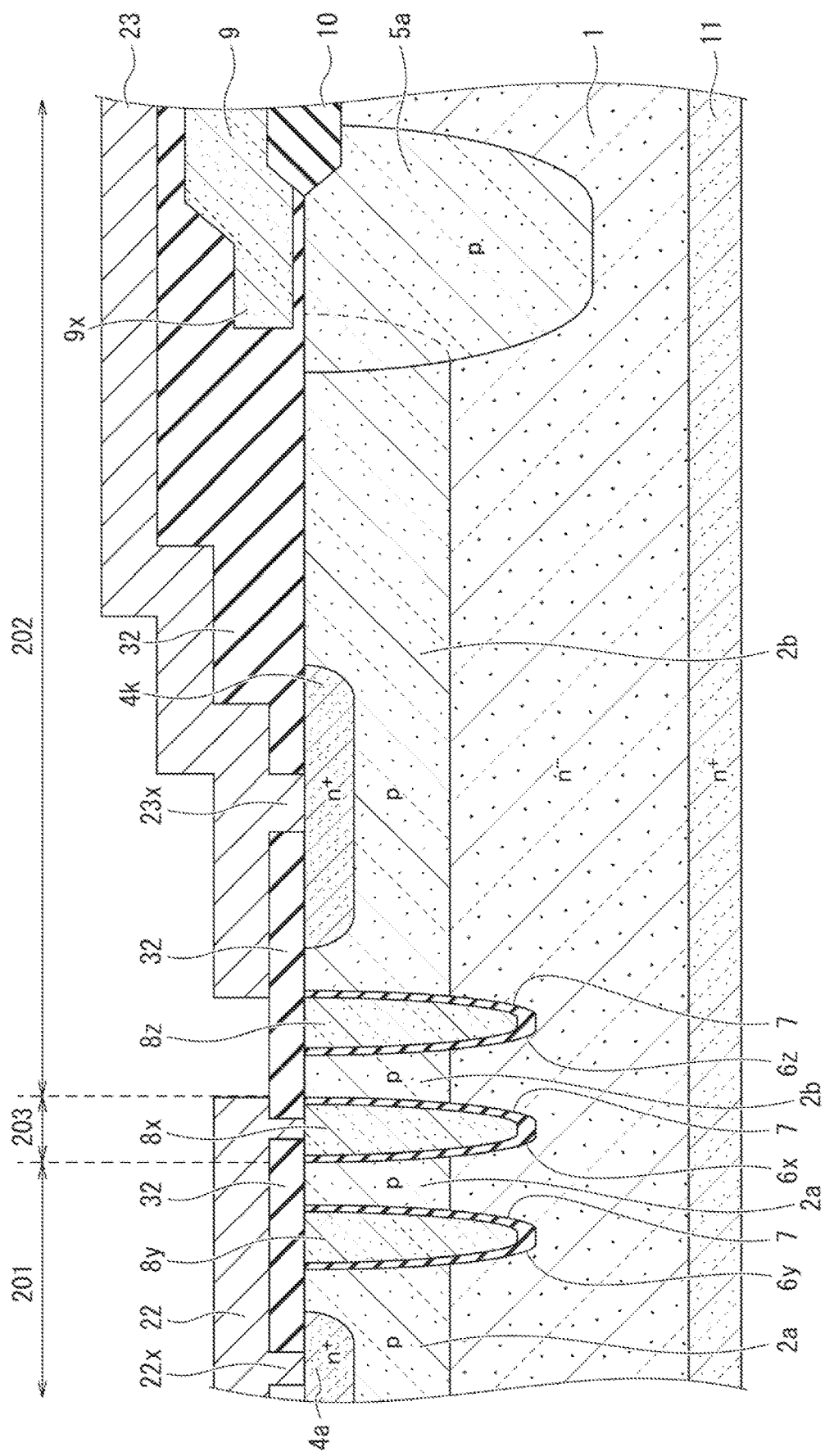
FIG. 13 is a cross-sectional view as viewed from direction C-C in FIG. 10.

FIG. 13 is a cross-sectional view as viewed from direction C-C corresponding to the upper-lower direction in FIG. 10. The well region 2a is provided at the upper part of the high-specific resistance layer 1 in the main element 201 illustrated on the left side in FIG. 13. The source region 4a is provided at the upper part of the well region 2a. The source region 4a is connected to the source electrode 22 via the contact 22x.

Similarly, the well region 2b is provided at the upper part of the high-specific resistance layer 1 in the sensing element 202 illustrated on the right side in FIG. 13. The source region 4k is provided at the upper part of the well region 2b. The source region 4k is connected to the source electrode 23 via the contact 23x.

The side surface and the bottom surface of the well region 2a at the edge on the right side is covered with the electric-field release region 5a. A field insulating film 10 is provided on the top surface of the electric-field release region 5a. The gate wire 9 is provided on the top surface of the electric-field release region 5a with the interlayer insulating film 32 interposed. FIG. 13 illustrates the case in which the left-side edge 9x of the gate wire 9 is located on the right side of the left-side side surface of the electric-field release region 5a.

FIG. 10 schematically indicates the position of the edge of the p-type electric-field release region 5a by the dashed and dotted line, and schematically indicates the position of the edge of the p-type electric-field release region 5b by the dashed and dotted line. FIG. 10 also indicates a part of the field insulating film 10 hidden under the gate wire 9 by the dashed and double-dotted line.

The semiconductor device according to the second embodiment has the configuration in which the first electrode 8x of the element-isolation trench 6x in the isolation region 203 is covered with the interlayer insulating film 32 so as to be isolated from the gate wire 9 connected to the respective gate electrodes 8d to 8f in the main element 201 and the respective gate electrodes 8g and 8h in the sensing element 202, as illustrated in FIG. 12. In addition, as illustrated in FIG. 11 and FIG. 13, the first electrode 8x of the element-isolation trench 6x is connected to the source electrode 22 so as to have the same potential as the source potential of the main element 201.

When the battery 102 is connected in the opposite direction to the semiconductor device according to the second embodiment, as illustrated in FIG. 2, the gate potential of the main element T1 and the sensing element T2 is led to be a low level, and the main element T1 and the sensing element T2 are thus in the OFF-state. However, since the first electrode 8x of the element-isolation trench 6x is isolated from the gate wire 9 of the main element 201 and the sensing element 202, and is connected to the source electrode 22 via the contact 22d provided at the opening of the interlayer insulating film 32, the potential of the first electrode 8x of the element-isolation trench 6x is led to be a high level that is the same as the source potential of the main element T1.

Upon the opposite connection of the battery 102 to the semiconductor device according to the second embodiment, as illustrated in FIG. 2, a difference in potential is caused between the respective sources of the main element T1 and the sensing element T2 since the diodes D4 and D5 are provided between the sources of the main element T1 and the sensing element T2. The source potential of the main element T1 is then led to be a positive potential, and the p-n junction diode implemented by the well region 2a and the high-specific resistance layer 1 in the main element 201 is thus biased in the forward direction, increasing the potential in the high-specific resistance layer 1 located adjacent to the element-isolation trench 6x accordingly.

If the first electrode 8x of the element-isolation trench 6x would be connected to the gate wire 9, the first electrode 8x of the element-isolation trench 6x is led to be a low level to cause the parasitic MOS structure 61 to operate, which may lead to a decrease in the breakdown voltage between the devices of the main element 201 and the sensing element 202 accordingly. However, the semiconductor device according to the second embodiment has the potential of the first electrode 8x of the element-isolation trench 6x that is the same as the source potential of the main element 201 and at the high level, so as to ensure the breakdown voltage between the devices of the main element 201 and the sensing element 202 with the operation of the parasitic MOS structure 61 avoided. This can ensure the breakdown voltage of the main element 201 and the sensing element 202 if the battery 102 is connected in the wrong direction, so as to prevent or decrease the leak current.

OTHER EMBODIMENTS

As described above, the invention has been described according to the first and second embodiments, but it should not be understood that the description and drawings implementing a portion of this disclosure limit the invention. Various alternative embodiments of the present invention, examples, and operational techniques will be apparent to those skilled in the art from this disclosure.

While the first and second embodiments have been illustrated above with the case of using the trench-gate MOS transistor as the main element 201, the present invention is not limited to this case, and the main element 201 may be a trench-gate IGBT, for example. In the case of using the IGBT as the main element 201, a semiconductor layer of $p^+$-type may be used instead of the $n^+$-type low-specific resistance layer 11 illustrated in FIG. 1, for example.

While the first and second embodiments have been illustrated above with the case of using Si for the semiconductor base body (1, 11), the present invention may also be applied to a case of using a wide band-gap semiconductor material, such as silicon carbide (SiC), gallium nitride (GaN), gallium oxide ($Ga_2O_3$), diamond, or aluminum nitride (AlN), other than Si.

The configurations disclosed in the first and second embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

The invention claimed is:
1. A semiconductor device comprising:
a main element;
a sensing element configured to detect a current of the main element; and
an isolation region isolating the main element and the sensing element from each other,
each of the main element and the sensing element including
a drift region of a first conductivity-type provided in a semiconductor base body,
a well region of a second conductivity-type provided at an upper part of the drift region,
a first main electrode region of the first conductivity-type provided at an upper part of the well region,
a gate electrode buried with a gate insulating film interposed in a trench in contact with the first main electrode region, the well region, and the drift region, and
a main electrode electrically connected to the first main electrode region, the isolation region including
- an element-isolation insulating film provided on a top surface of the semiconductor base body interposed between the well region of the main element and the well region of the sensing element, and
- a first wire provided on a top surface of the element-isolation insulating film and electrically connected to the main electrode of the main element.

2. The semiconductor device of claim 1, wherein the first wire is isolated from each of a first gate wire connected to the gate electrode of the main element and a second gate wire connected to the gate electrode of the sensing element.

3. The semiconductor device of claim 1, wherein the main electrode of the main element extends onto the first wire so that the first wire is connected to the main electrode of the main element via a first contact.

4. The semiconductor device of claim 2, further comprising a gate runner connected to the first gate wire via a second contact and connected to the second gate wire via a third contact.

5. The semiconductor device of claim 1, further comprising a diode having a cathode connected to the first main electrode region of the main element and an anode connected to the first main electrode region of the sensing element.

6. The semiconductor device of claim 1, further comprising a diode having a cathode connected to the second main electrode region of the main element.

* * * * *